(12) United States Patent
Hostetler

(10) Patent No.: US 12,389,538 B2
(45) Date of Patent: Aug. 12, 2025

(54) VARYING DIAMETERS OF POWER-VIAS IN A PCB BASED ON VIA LOCATION

(71) Applicant: HEWLETT PACKARD ENTERPRISE DEVELOPMENT LP, Spring, TX (US)

(72) Inventor: Brian Mark Hostetler, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 162 days.

(21) Appl. No.: 18/159,930

(22) Filed: Jan. 26, 2023

(65) Prior Publication Data

US 2024/0260188 A1    Aug. 1, 2024

(51) Int. Cl.
*H05K 1/11* (2006.01)
*H05K 1/02* (2006.01)
*H05K 3/40* (2006.01)

(52) U.S. Cl.
CPC .......... *H05K 1/115* (2013.01); *H05K 1/0218* (2013.01); *H05K 3/4038* (2013.01); *H05K 2201/093* (2013.01); *H05K 2201/09636* (2013.01); *H05K 2201/10818* (2013.01); *H05K 2201/10984* (2013.01)

(58) Field of Classification Search
CPC ...... H05K 1/02; H05K 1/0213; H05K 1/0215; H05K 1/0222; H05K 1/0224; H05K 1/0262; H05K 1/0263; H05K 1/0265; H05K 1/112; H05K 1/113; H05K 1/115; H05K 1/116; H05K 1/181; H05K 3/46; H05K 3/429; H05K 3/4038; H05K 2201/093; H05K 2201/09636; H05K 2201/10818; H05K 2201/10984; H01L 21/56; H01L 21/563; H01L 21/768; H01L 23/12; H01L 23/13; H01L 23/32; H01L 23/50; H01L 23/367; H01L 23/481; H01L 23/49822; H01L 23/49816; H01L 23/49827; H01L 23/49838; H01L 23/5385; H01L 23/5386; H01L 24/05; H01L 24/06; H01L 24/11; H01L 24/13; H01L 24/14; H01L 24/16; H01L 24/24; H01L 24/32; H01L 24/48; H01L 24/73
USPC ........ 361/783, 728; 257/773, 774, 676, 698, 257/738, 778, 782, 786; 174/266
See application file for complete search history.

(56) References Cited

U.S. PATENT DOCUMENTS 8,907,496 B1    12/2014    Ning et al.
10,347,592 B2    7/2019    Stone
(Continued)

OTHER PUBLICATIONS

Hughes, M., "Which Via Should I Choose? A Guide to Vias in PCB Design," available online at <https://www.allaboutcircuits.com/technical-articles/which-via-should-i-choose-a-guide-to-vias-in-pcb-design/>, Nov. 7, 2018, 10 pages.

*Primary Examiner* — Binh B Tran
(74) *Attorney, Agent, or Firm* — Jones Robb PLLC

(57) ABSTRACT

An electronic device may comprise a printed circuit board (PCB) and a power source and processing circuitry mounted to the PCB. The PCB comprises one or more power planes and a plurality of power vias electrically connected to the power planes. The power sources are electrically connected to the power planes. The processing circuitry is electrically connected to the plurality of power vias through a plurality of interconnects. Respective diameters of the plurality of power vias vary based on location.

10 Claims, 9 Drawing Sheets

(56) References Cited

U.S. PATENT DOCUMENTS

| | | | |
|---|---|---|---|
| 10,867,916 | B2 | 12/2020 | Biswas et al. |
| 11,336,167 | B1* | 5/2022 | Vinciarelli ............ H05K 1/0298 |
| 2005/0098886 | A1* | 5/2005 | Pendse .............. H01L 23/49838 |
| | | | 257/E23.079 |
| 2005/0146017 | A1* | 7/2005 | Koide ..................... H01L 23/32 |
| | | | 257/E23.079 |
| 2010/0289596 | A1* | 11/2010 | Makino ................... H01P 5/085 |
| | | | 333/32 |
| 2011/0074047 | A1* | 3/2011 | Pendse ................. H01L 21/563 |
| | | | 257/782 |
| 2012/0068322 | A1* | 3/2012 | Hanabe .................. H01L 23/50 |
| | | | 257/676 |
| 2014/0268586 | A1* | 9/2014 | Hoshi ..................... H01L 23/50 |
| | | | 361/728 |
| 2015/0054155 | A1* | 2/2015 | Ohara ................... H01L 23/562 |
| | | | 257/738 |
| 2017/0311471 | A1* | 10/2017 | Mao .................... H05K 7/14329 |
| 2018/0168039 | A1* | 6/2018 | Numagi ............. H01L 23/49838 |
| 2018/0184514 | A1* | 6/2018 | Yamada ............... H05K 1/0265 |
| 2018/0197801 | A1* | 7/2018 | Naruse ................ H05K 1/0262 |
| 2020/0411494 | A1* | 12/2020 | Hovis ................... H01L 23/481 |
| 2020/0411495 | A1* | 12/2020 | Hovis ..................... G06F 1/183 |
| 2021/0050318 | A1* | 2/2021 | Marquart ............ H01L 25/0655 |
| 2021/0193567 | A1* | 6/2021 | Cheah ................. H01L 23/5385 |
| 2021/0407948 | A1* | 12/2021 | Kim ........................ H01L 24/14 |
| 2022/0139874 | A1* | 5/2022 | Lee .......................... H01L 25/50 |
| | | | 257/774 |
| 2022/0272834 | A1* | 8/2022 | Westwood ........... G01R 1/0483 |
| 2024/0006286 | A1* | 1/2024 | Sain ................. H01L 23/49838 |
| 2024/0006324 | A1* | 1/2024 | Cheah .................... H01L 24/17 |
| 2024/0021560 | A1* | 1/2024 | Yeh ........................ H01L 22/14 |

* cited by examiner

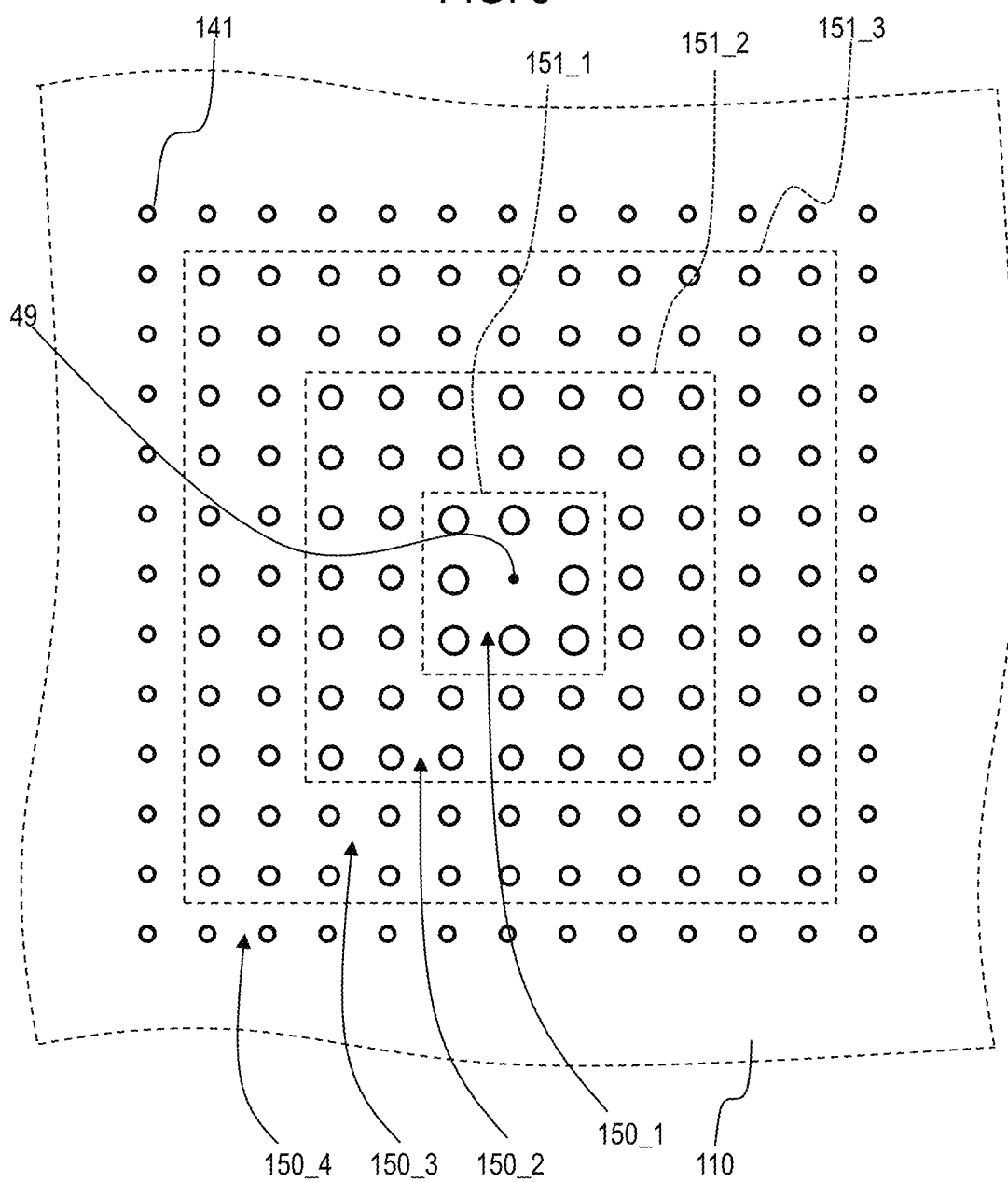

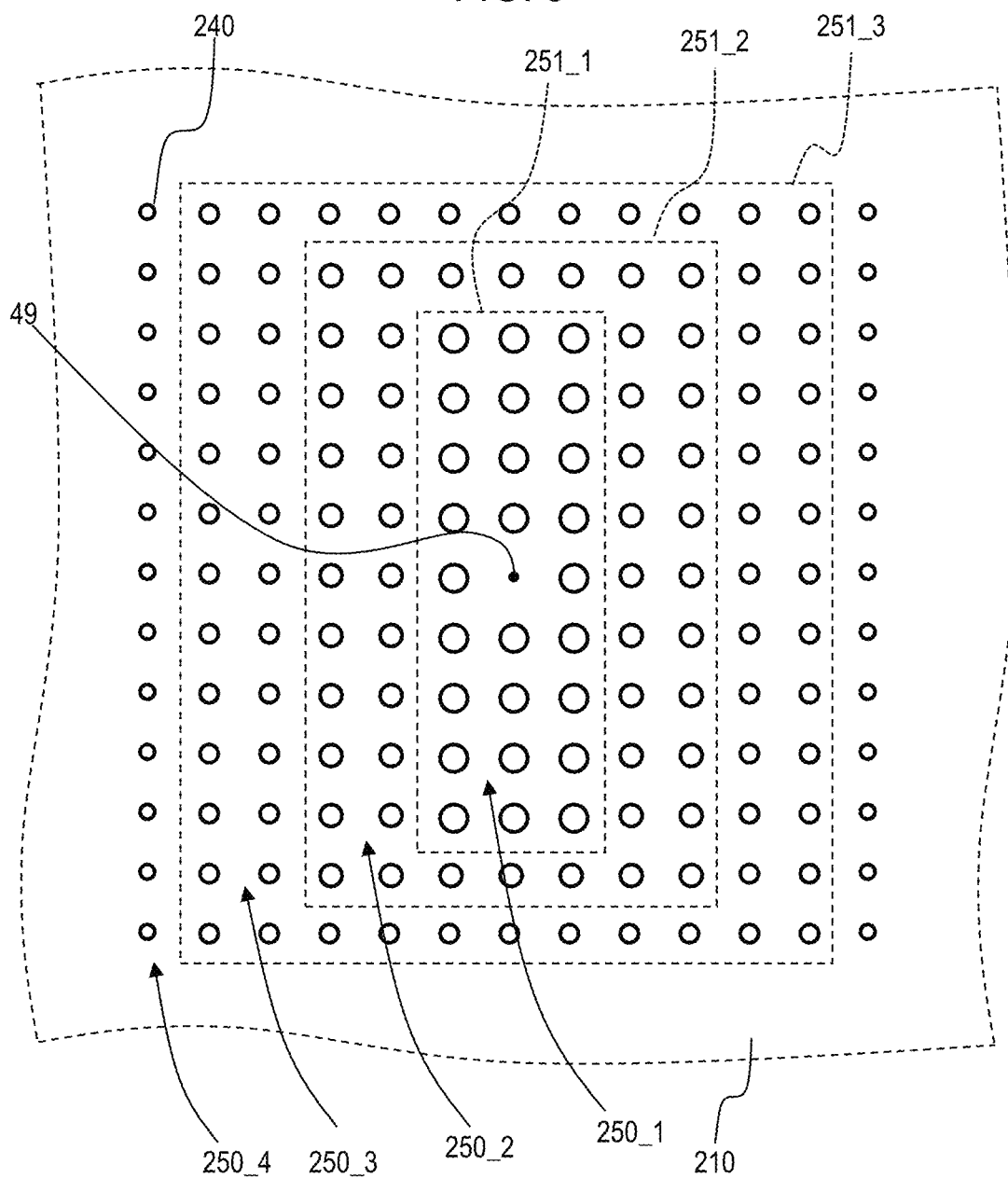

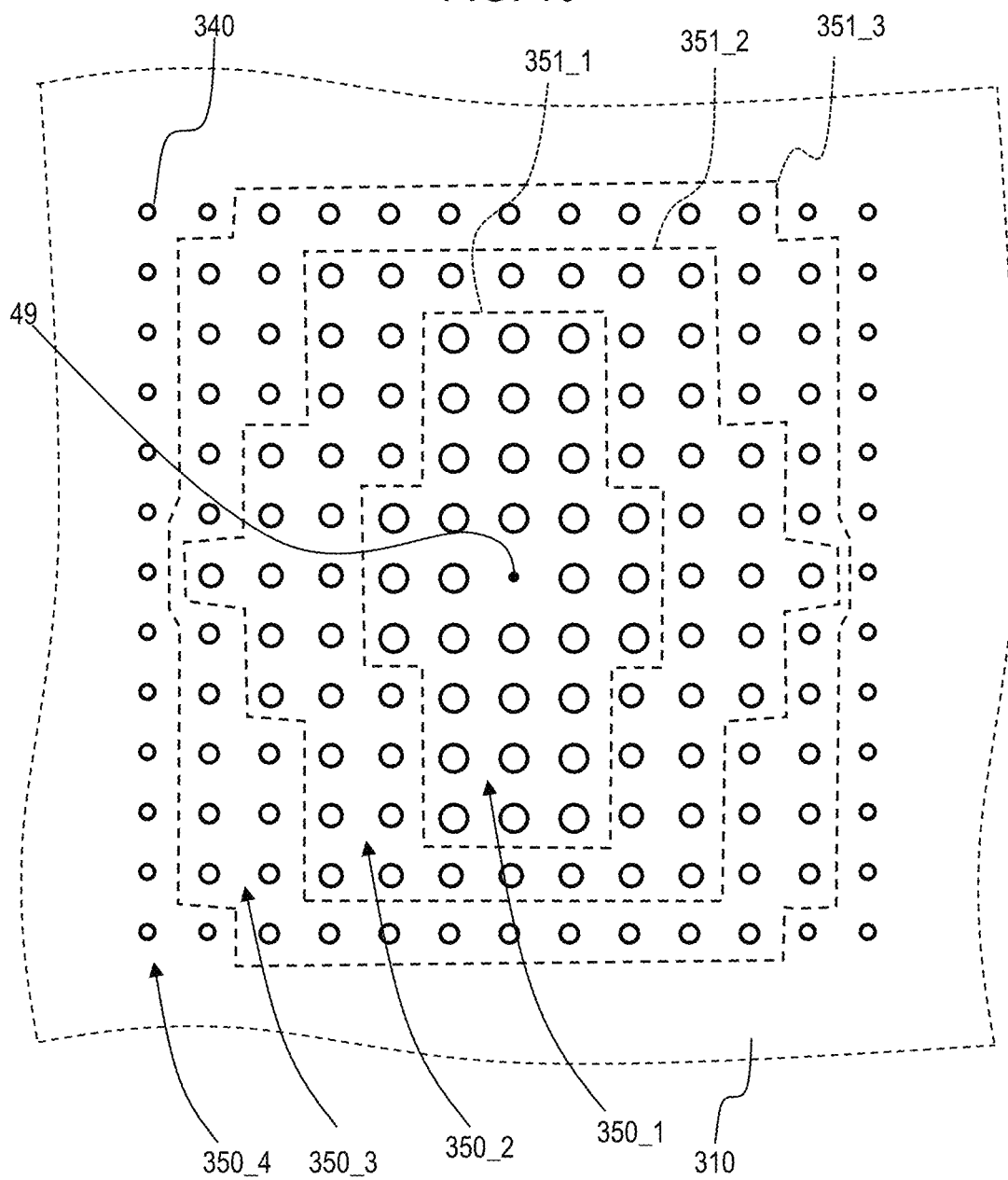

VARYING DIAMETERS OF POWER-VIAS IN
A PCB BASED ON VIA LOCATION

INTRODUCTION

Electronic devices (e.g., computers, networking devices, or other electronic devices) may comprise processing circuitry, such as a central processing unit (CPU), an application-specific-integrated-circuit (ASIC), or other processing circuitry. Such processing circuitry may be mounted on a printed circuit board (PCB) and electrically connected to one or more power sources (e.g., voltage regulators) of the PCB. The processing circuitry and PCB may be electrically connected to one another according to a surface mounting technique by an array of electrical interconnects provided between the PCB and processing circuitry, such as a ball-grid array (BGA), land-grid array (LGA), pin-grid array (PGA), or other type of interconnect arrangement. These electrical interconnects may comprise connectors (e.g., contact pads, pins, sockets, etc.) on a top face of the PCB (referred to herein as PCB connectors) and corresponding complementary connectors on a bottom face of a package of the processing circuitry (referred to herein package connectors), with the PCB connectors and package connectors engaging to form the interconnects. The interconnects may also comprise solder (e.g., solder balls), which may serve as part of the package connectors or may be positioned between the package connectors and PCB connectors. In some examples, solder balls may be initially coupled to the processing circuitry (e.g., forming a BGA), then the processing circuitry may be positioned on the PCB such that the solder balls are in contact with corresponding PCB connectors (e.g., contact pads), and then the solder balls may be reflowed to establish connections with the PCB connectors.

The electrical interconnects described above are connected to the power sources mounted on the PCB by a number of power planes and a number of power vias provided in the PCB. The power planes comprise conductive layers or traces within the PCB that extend along lateral dimensions of the PCB. The power vias comprise bores (holes) that extend along a thickness dimension of the PCB (perpendicular to the lateral dimensions) into which conductive material such as copper has been disposed (e.g., by plating a thin layer on interior surfaces of the bore) to form a conductive path from the power planes to the PCB connectors.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

FIG. 8 is a block diagram illustrating a cross-section of a variation of the electronic device of FIG. 2 along section 3-3.

FIG. 9 is a block diagram illustrating a cross-section of another variation of the electronic device of FIG. 2 along section 3-3.

FIG. 10 is a block diagram illustrating a cross-section of another variation of the electronic device of FIG. 2 along section 3-3.

DETAILED DESCRIPTION

Figure 1:
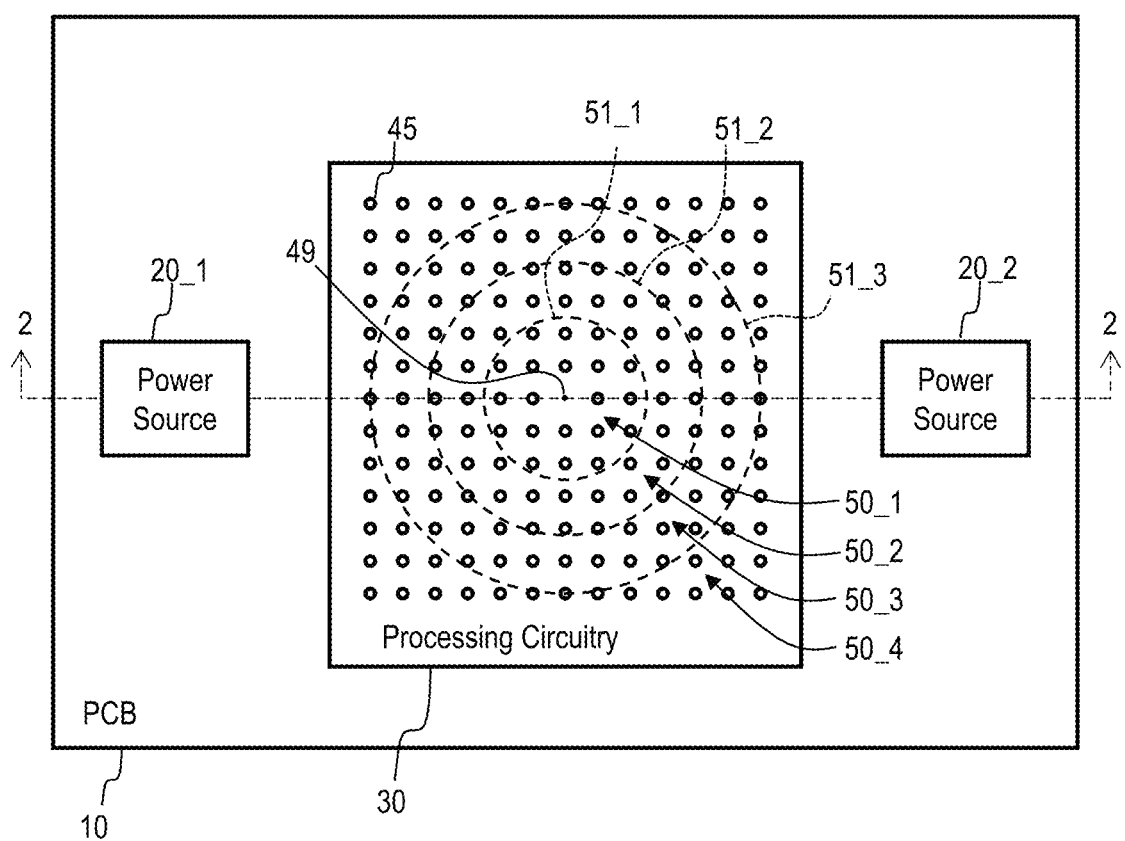
FIG. 1 is a block diagram illustrating a top view of an example electronic device.

In some electronic devices with processing circuitry, current may flow unevenly through the electrical interconnects that connect the processing circuitry to the PCB. In other words, more current may flow through some of the electrical interconnects than others. In particular, electrical interconnects that are closer to the center or core of the array of interconnects may have less current flowing through them, whereas electrical interconnects closer to a periphery of the array of interconnects may have more current flowing through them. Similarly, the voltages at the processing circuitry side of each of the interconnects may be imbalanced, with interconnects that are closer to the center of the array of interconnects having lower voltages and interconnects that are closer to the periphery of the array having greater voltages.

An imbalance in currents/voltages between the electrical interconnects may occur in part, for example, because some electrical interconnects are physically closer to the power sources than others. For example, the power sources may be arranged around the periphery of the processing circuitry, for example, along two opposite sides thereof, and thus in such devices the interconnects along edges of the array may be nearer to the power sources than interconnects in a middle of the array. Because some interconnects are closer to the power sources than others, the current paths between the power sources and the electrical interconnects have varying lengths and may behave as if they effectively had different resistances. Thus, in some electronic devices the electrical interconnects that are disposed closer to the power sources (e.g., near a periphery of the array of interconnects) may tend to draw more current and have higher voltages than electrical interconnects disposed farther from the power sources (e.g., near a center of the array).

The imbalances in current/voltage between the electrical interconnects may give rise to various challenges. For example, the imbalances may result in some electrical interconnects having currents and/or voltages that are too high, which may cause damage or otherwise degrade performance of the system. As another example, the imbalances may result in some electrical interconnects having currents and/or voltages that are too low, which may degrade performance of the system. As another example, the imbalance in currents/voltages may result in uneven heat generation across the processing circuitry package, thus making heat dissipation more challenging.

As noted above, one potential issue that can arise due to an imbalance in current between interconnects is that some electrical interconnects may carry too large of a current, which can cause electromigration. Electromigration is a phenomenon in which currents flowing through a current path causes conductive materials of the current path to physically move (migrate) from their original positions to new positions, which over time can result in the depletion of conductive materials from certain portions of the current path and the accumulation of those materials elsewhere. Such depletion of conductive materials in the current paths due to electromigration may degrade the performance of the device. Generally, the stronger the current the greater the degree of electromigration, and if currents are kept below certain thresholds, then electromigration may be avoided or reduced to acceptable levels. These thresholds may be referred to herein as the current rating of the electrical interconnects. The current rating of an interconnect may vary depending on the type of material used for the interconnect or via, but generally the current ratings are around 1-2 amps per electrical interconnect. However, the imbalance in current between interconnects may make it more difficult to ensure that all interconnects remain below their current ratings. For example, in devices in which the average per-interconnect current is close to or at the per-interconnect current rating, imbalances between the interconnects in current such as those described above may result in some of the interconnects and vias carrying currents that exceed their current rating notwithstanding the average per-interconnect current being below the current rating. That is, the imbalances described above result in a wider distribution of currents around the average current, with more outliers that may exceed the per-interconnect current rating. For example, interconnects that are closer to the power sources (e.g., interconnects closer to the edges and corners of the array of interconnects) may end up carrying currents that exceed the current rating in some circumstances, while other interconnects closer to the center or "core" of the array may carry lower currents.

For example, in one simulation of a system with 190 electrical interconnects and a theoretical total load of about 370 A, it was found that the average per-interconnect current draw (1.95 A) was less than a current rating of the interconnects (2 A), but, despite the average per-interconnect current draw being less than the current rating, approximately 40% of the interconnects had currents exceeding the 2 A rating and a significant proportion of these had currents greatly exceeding the 2 A rating (e.g., approximately 12% of all the interconnects exceeded 2.5 A and approximately 3% of all the interconnects exceeded 3 A). It was also found in this simulation that the interconnects farther from a center of the array of interconnects (i.e., closer to the power sources) tended to have higher per-interconnect currents, with nearly all of the interconnects whose current exceeded the 2 A rating being positioned around a periphery of the array and the interconnects with the highest currents being positioned at outer corners of the array.

One approach to reducing the per-interconnect current is to provide more interconnects. However, this can increase costs of the device. Moreover, providing more interconnects may increase the area occupied by the array of interconnects, which can have a detrimental effect on signal integrity of signals being passed between the processing circuitry and other devices on the PCB. This may occur because as the array of interconnects becomes larger, the other devices on the PCB may need to be moved farther from the center of the processing circuitry to accommodate the increased size of the interconnect array, and thus the distances that must be traversed by signals communicated between these devices and the processing circuitry will be increased. Increasing the distance over which the signals are communicated can reduce their signal integrity. Thus, in some circumstances, the number of interconnects (and hence the size of the interconnect array) may need to be restricted to avoid degrading signal integrity. Moreover, although adding more interconnects may reduce the average current per-interconnect, adding more interconnects does not address the issue of current imbalance between the interconnects. In fact, adding more interconnects may exacerbate current imbalances, as more interconnects means a larger interconnect array and thus larger distances between the power sources and the central "core" interconnects in the array.

To address these issues, in examples disclosed herein the power vias in the PCB are provided with varying bore diameters, with the diameters of the power vias varying based on their locations. More specifically, in some examples, the diameters of the power vias vary based on the distances of the power vias from a reference point, such as a center of the processing circuitry. In some examples, power vias that are farther from the center of the processing circuitry may have smaller diameters, whereas power vias that are closer to the center of the processing circuitry may have larger diameters. In other words, power vias that are farther from the power sources (e.g., voltage regulators) on the PCB have larger diameters, while power vias that are closer to the power sources on the PCB may have smaller diameters. Varying the diameters of the power vias in this manner results in variation in the resistances of the power vias based on their location, since larger diameter power vias have move conductive material and thus less resistance than smaller diameter power vias. This variation in resistances of the power vias (due to their varying diameters) may be controlled so as to offset the above-described variation in currents that flow through the power interconnects. Specifically, the interconnects that might otherwise have abnormally high currents flowing through them due to their location—e.g., the interconnects near the periphery of the processing circuitry—may be coupled to power vias that are relatively narrow in diameter, thus reducing the flow of current through these interconnects down closer to the average per-interconnect current. Conversely the interconnects that might otherwise have abnormally low currents flowing through them due to their location—e.g., the interconnects near the center of the processing circuitry—may be coupled to power vias that are relatively wider in diameter, thus increasing the flow of current through these interconnects. Thus, the degree of variation in current across the power interconnects may be reduced by varying the diameters of the power vias. Moreover, the interconnects that might otherwise have carried currents that would exceed their rating in previous designs, such as interconnects at the periphery of the processing circuitry, may have their currents reduced to below their current ratings in examples disclosed herein because the power vias coupled thereto may have reduced diameters.

Turning now to the figures, various devices, systems, and methods in accordance with aspects of the present disclosure will be described.

Figure 2:
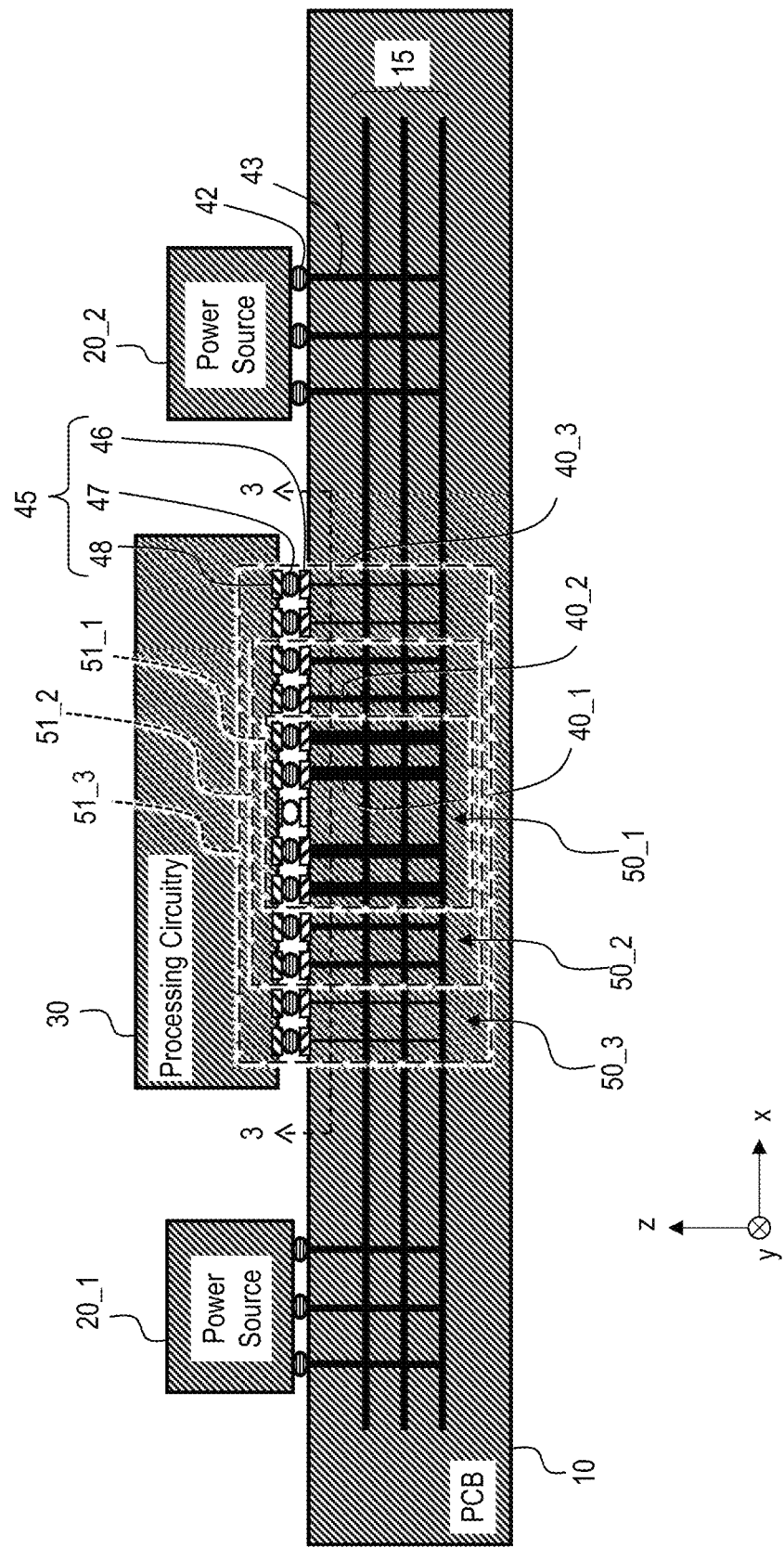
FIG. 2 is a block diagram illustrating a cross-section of the electronic device of FIG. 1 along section 2-2.
Figure 3:
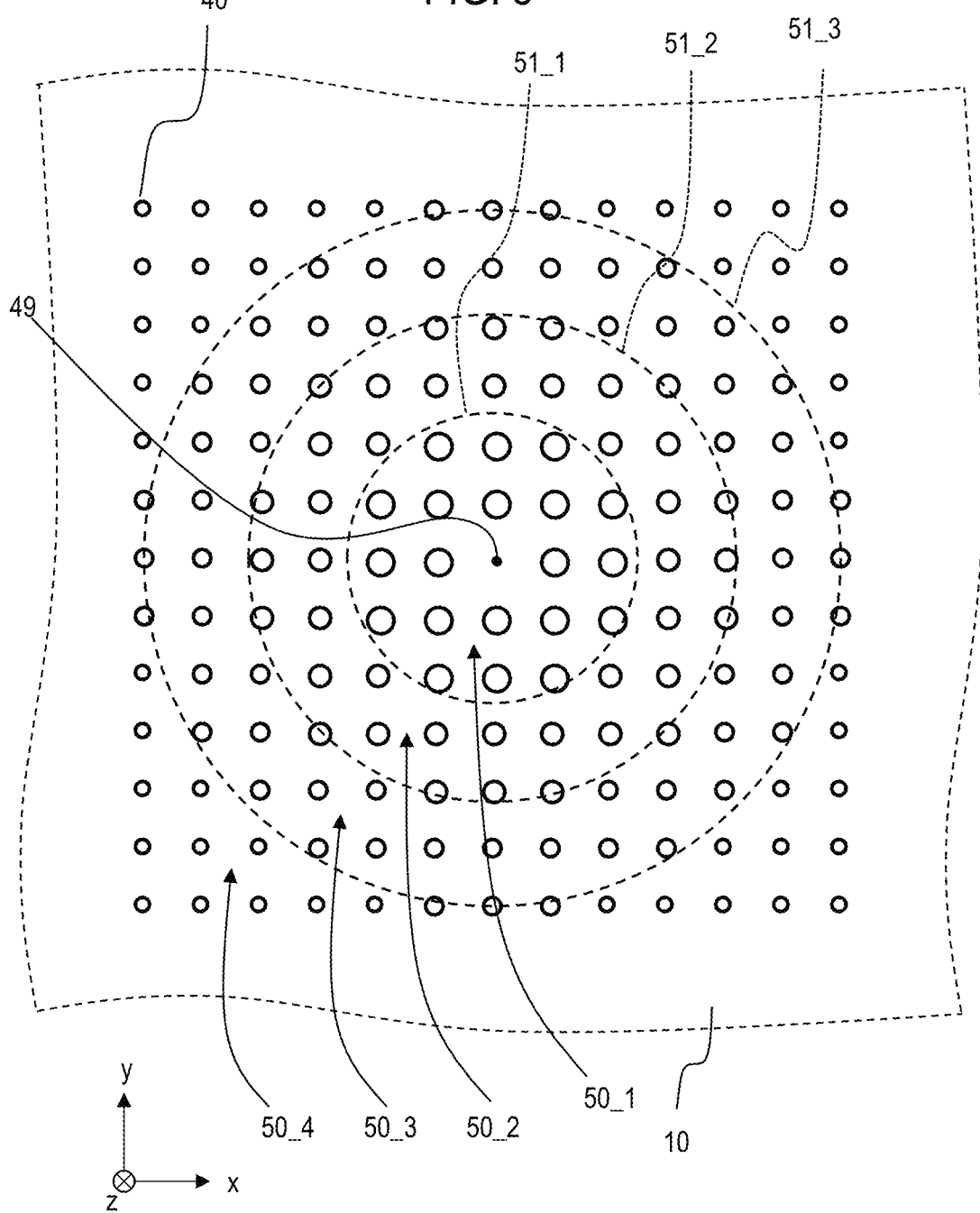
FIG. 3 is a block diagram illustrating a cross-section of the electronic device of FIG. 2 along section 3-3.
Figure 4:
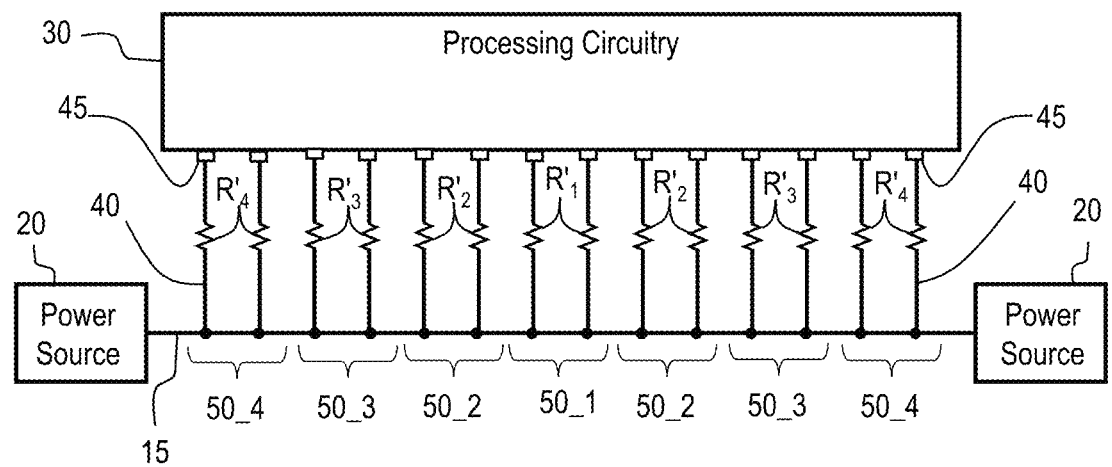
FIG. 4 is an electrical schematic of a portion of power circuitry of the example electronic device of FIG. 1.
Figure 5:
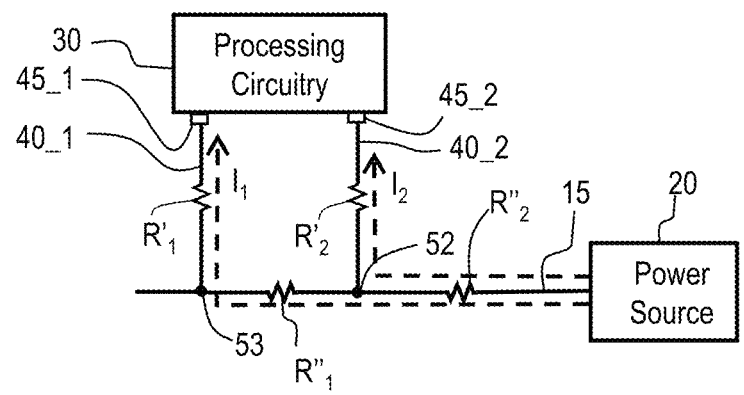
FIG. 5 is an electrical schematic of a portion of the power circuitry of the example electronic device of FIG. 1.

FIGS. 1-5 illustrate an electronic device 5. FIGS. 1-3 comprise block diagrams conceptually illustrating the electronic device 5. FIGS. 4 and 5 comprise electrical schematics conceptually illustrating aspects of the electrical connections between various components of the electronic device 5. It should be understood that FIGS. 1-5 are not intended to illustrate specific shapes, dimensions, or other structural details accurately or to scale, and that implementations of the electronic device 5 may have different numbers and arrangements of the illustrated components and may also include other parts that are not illustrated.

As shown in FIG. 1, the electronic device 5 comprises a printed circuit board (PCB) 10, one or more power sources 20 (e.g., power sources 20_1 and 20_2 in FIG. 1) coupled to the PCB 10, and an electronic component (e.g., processing circuitry 30) coupled to the PCB 30 by an array of power interconnects 45. In the figures and description below, it is assumed for the sake of description that the electronic component comprises processing circuitry 30, but it should be understood that any type of electronic component that may be mounted to a PCB via an array of power interconnects 45 may be used in lieu of the processing circuitry 30. For example, the electronic component could be a surface mount power connector, an optical transceiver, or any other component.

As shown in the cross-section of FIGS. 2, the PCB 10 comprises one or more power planes 15. Three power planes 15 are illustrated in FIG. 2 as an example, but any number of power planes 15 may be used. The power planes 15 form, or are part of, internal layers of the PCB 10 and extend through the PCB 10 along lateral dimensions thereof (the lateral dimensions of the PCB being parallel to the x and y axes, respectively, which are indicated in FIGS. 1-3). The power planes 15 comprise electrically conductive materials, such as copper, arranged as layers and/or traces configured to convey electrical power. As shown in FIG. 2, the PCB 10 further comprises power vias 40 and 43 which extend through the PCB 10 perpendicular to the power planes 15 along a height dimension of the PCB 10 (the height dimension of the PCB being parallel to the z axis, which is indicated in FIGS. 1-3). The power vias 40 are physically and electrically connected to the processing circuitry 30 via connectors 45 (described in greater detail below) and are also physically and electrically connected to the power planes 15. The power vias 43 are physically and electrically connected to the power sources 20 via connectors 42 and are also physically and electrically connected to the power planes 15. Thus, the power planes 15 and vias 40 and 43 form electrically conductive paths between the power sources 20 and the processing circuitry 10. The power vias 40 and 43 each comprise a bore (hole) formed in the PCB 10, for example by drilling, and a conductive material disposed in the bore, for example by plating an interior surface of the bore. When the conductive materials are disposed within the bore they contact a portion of the power plane 15 and an electrical connection is made.

The power sources 20 comprise devices configured to provide electrical power to the processing circuitry 30. For example, the power sources 20 may comprise voltage regulators (e.g., a voltage regulator module (VRM)). In some examples, the power sources 20 supply direct-current (DC) electricity to the processing circuitry 30, with a positive or negative supply voltage $V_{DD}$ being supplied to some of the power planes 15 and a ground voltage GND being supplied to other power planes 15. The power planes 15 that carry the supply voltage $V_{DD}$ may also be referred to herein as supply power planes 15, while the power planes 15 that carry the ground voltage GND may also be referred to herein as ground power planes 15. For simplicity, FIGS. 1-5 illustrate just supply power planes 15 and interconnects 45 and vias 40 and 43 connected thereto, but it will be understood that one or more ground power planes and associated vias are also present and may be similarly configured. Power vias 40 that are coupled to supply power planes 15 may also be referred to as supply power vias 40, and power vias 40 that are coupled to ground power planes 15 may also be referred to as ground power vias 40. In some examples, each supply power via 40 is coupled to all of the supply power plane 15 as shown in FIG. 2 (and similarly each ground power via 40 may be coupled to each ground power plane 15), but in other examples some or all of the supply power vias 43 may be coupled to just a subset of the supply power planes 15 (and similarly some or all of the ground power vias 40 may be coupled to just a subset of the ground power planes 15).

The processing circuitry 30 comprises a circuitry configured to execute machine readable instructions and/or dedicated logic configured for performing specific tasks. For example, the processing circuitry 30 may comprise a processor, a central processing unit (CPU), a System-on-Chip (SoC), a graphical processing unit (GPU), an Application Specific Integrated Circuit (ASIC), a Complex Programable Logic Device (CPLD), a Field Programable Gate Array (FPGA), a microcontroller, a hardware accelerator, or other dedicated hardware. The processing circuitry 30 may comprise a package or substrate (not illustrated) that supports and/or houses internal components of the processing circuitry.

As shown in FIGS. 1 and 2, the electronic device further comprises a plurality of power interconnects 45 arranged in an array. The power interconnects 45 electrically connect the processing circuitry 30 to the power vias 43, with the power interconnects 45 serving as an interface between internal circuitry of the processing circuitry 30 and the internal circuitry of the PCB 10 (i.e., the power vias 43). As shown in FIG. 2, in some examples, the power interconnects 45 comprise connectors 48 that are part of (or coupled to) the processing circuitry 30 and connectors 46 that are part of (or coupled to) the PCB 10, with the connectors 46 and 48 being electrically connected (e.g., by an intermediary such as the solder 47 shown in FIG. 2). The connectors 48 are disposed on one side of the processing circuitry 30 (more specifically, on one side of the package or substrate thereof), referred to herein as the bottom side of the processing circuitry 30, whereas the connectors 46 are disposed on a side of the PCB 10 facing the processing circuitry 30, referred to herein as the top side of the PCB 10. In FIG. 2 the connectors 46 and 48 are illustrated as electrical pads between which solder balls 47 are disposed, and the solder balls 47 may become connected to the connectors 46 and 48 via heating (e.g., in a solder reflow process). In other examples (not illustrated), the connectors 46 and 48 may comprise pins and sockets or any other type of electrical connector, as would be familiar to those of ordinary skill in the art. In some examples, one or both of the connectors 48 and 46 are omitted, in which case the solder balls 47 may make direct contact with the vias 43 and/or the internal circuitry of the processing circuitry 30. In some examples, the solder balls 47 are omitted and the connectors 48 and 46 may make direct contact with one another. The type of interconnects 45 that are used and the manner of connection therebetween is not limited in the electronic device 5, except that the interconnects 45 are disposed in an array and coupled to the vias 43.

In FIG. 1, the array of interconnects 45 is shown as a regular grid with relatively uniform spacings between interconnects 45. In other examples, the interconnects 45 (and hence the vias 43 coupled thereto) may be disposed in an array having irregular spacing between individual interconnects 45 or regular spacings between some but not necessarily all of the interconnects 45. Moreover, in FIG. 1 the array of interconnects 45 is shown as having a generally rectangular profiled, but in other examples the array may have a non-rectangular profile (e.g., a circular profile, an irregularly shaped profile, or any other shape of profile).

In some examples, additional interconnects for carrying data/communication signals may also be provided to connect the processing circuitry 30 to devices mounted on the PCB 10, but these interconnects are not illustrated herein to simplify the figures. Such interconnects for carrying data signals may be, for example, disposed around a periphery of the interconnects 45, or in other words farther from a center 49 of the array than the interconnects 45.

As shown in FIGS. 2 and 3, the power vias 40 are coupled to the interconnects 45, and thus the power vias 40 are arranged in an array that is similar to the array of the interconnects 45. Moreover, the bore diameters of the power vias 40 vary based on their location within this array, as described above. In FIG. 2, bore diameters of the power vias 40 are represented by thicknesses of the lines depicting the power vias 40, whereas in FIG. 3 the diameters of the power vias are represented by the sizes of the circles that depict the power vias 40.

In some examples, the diameters of the power vias 40 vary based on their distances from a reference point. For example, the reference point may be a center 49 of the array interconnects 45 (which may correspond roughly to a center of the processing circuitry 30 in a top-down view such as in FIG. 1), and in such examples the diameters of the power vias 40 vary based on their distances from the center 49, with diameters tending to decrease the farther the power via 40 is from the center 49 as shown in FIGS. 2 and 3. For example, as shown in FIG. 2 a power via 40_1 may have a diameter that is greater than that of a power via 40_2 which is father from the center 49. Similarly, the power via 40_2 may have a diameter that is greater than that of a power via 40_3 that is still farther from the center 49. In other examples, the reference point may correspond to the power sources 20, and the diameters of the power vias 40 may vary based on their distances from the power sources 20, with the diameters tending to increase the farther the power via 40 is from any of the power sources 20. For example, as shown in FIG. 2, the power via 40_1 may have a diameter that is greater than that of a power via 40_2 which is closer to the power source 20_2, and the power via 40_2 may have a diameter that is greater than that of the power via 40_3 which is still closer to the power source 20_2.

The above-described variation in diameter of the power vias 40 based on distance from a reference point may include individual or group-based variation. Individual variation refers to each power via 40 having its diameter determined based in the specific location of that individual power via 40, for example based on a predefined formula (as described further below). Group based variation may comprise a group of power vias 40 being given the same bore diameter as one another, wherein the bore diameter is based on the general location of the group. Specifically, in some examples, the array of power vias 40 is divided into a number of zones 50 or regions, with each power via 40 that is located in a given zone 50 or region having the same bore diameter as other power vias 40 also located in the same given zone 50, but power vias 40 located in different zones 50 having different bore diameters. In some examples, the zones 50 that are generally farther from the center 49 comprise power vias 40 having smaller bore diameters that zones 50 that are closer to the center 49 (or conversely, the zones 50 that are farther from the power sources 20 may comprise power vias 40 having larger bore diameters than zones 50 that are closer to the power sources 20). For example, as shown in FIG. 2, the power vias 40_1 through 40_3 are disposed in the zones 50_1 through 50_3, with the power vias 40_1 having a first bore diameter, the power via 40_2 having a second bore diameter less than the first bore diameter, and the power via 40_3 having a third bore diameter less than the second bore diameter.

As noted above, the variation in the diameters of the power vias 40 may reduce the degree to which currents vary between the interconnects 45. This occurs at least in part because the variation in diameter of the power vias 40 results in these power vias 40 having different resistances. Specifically, in examples disclosed herein, each power via 40 has an effective resistance, which is labeled R' in FIGS. 4-6, and the magnitude of this resistance R' depends on the diameter of the power via 40. Thus, in the example of FIG. 4, the power vias 40 in the zone 50_1 each have a resistance of $R'_1$, the power vias 40 in the zone 50_2 each have a resistance of $R'_2$, and so on, with the resistances R' increasing the farther the power via 40 are from the center 49 (e.g., $R'_1 < R'_2 < R'_3 < R'_4$) due to the diameters of the power vias 40 increasing. Thus, the variations in current that would otherwise occur without the variation in via diameter may be mitigated by providing those power vias 40 that would otherwise carry too much current with higher resistances R' (smaller diameters), thereby reducing the current flowing therethrough, and providing those power via 40 that would otherwise carry too little current with lower resistance R' (larger diameters), thereby increasing the current flowing therethrough. In other words, the resistance R' of the power vias 40 are controlled so as to offset the current variations.

More specifically, the amount of current flowing through any given interconnect 45 depends in part on the total effective resistance of the current paths from the power sources 20 to the interconnect 45. The total effective resistance of these current paths has two components, a via resistance associated with the power via 40 portion of the current path and a power plane resistance associated with the power plane 15 portion of the current path. Because the interconnects 45 are all located at different locations relative to the power sources 20, the power plane 15 portions of their respective current paths are different, with some being longer than others, and thus the power plane 15 portions of these current paths behave as if they have different power plane resistances. For example, FIG. 5 shows two such current paths, with one path flowing from power source 20 to an interconnect 45_1 through a power plane 15 and power via 40_1, and another current path flowing from power source 20 to an interconnect 45_2 through the power plane 15 and power via 40_2. The first current path to the interconnect 45_1 has a power plane resistance of $R''_1 + R''_2$ (since current $I_1$ flows through both resistances $R''_1$ and $R''_2$) and a via resistance of $R'_1$, and the second current path to the interconnect 45_2 has a power plane resistance of $R''_2$ and a via resistance of $R'_2$. Thus, because the power via 40_1 is farther from the power source 20 than is the power via 40_2, the power plane resistance of the first current path ($R''_1 + R''_2$) is greater than the power plane resistance of the second current path ($R''_2$). Accordingly, if it were the case that the vias 40_1 and 40_2 had the same diameter (and hence the same via resistance $R'_1 = R'_2$), then the total resistance of the first current path ($R'_1 + R''_1 + R''_2$) would be greater than the total resistance of the second current path ($R'_1 + R''_2$), and therefore the current $I_1$ would be smaller than the current $I_2$. This is how the current imbalances described above may occur in prior designs. However, in examples disclosed herein this current imbalance can be canceled out by changing $R'_1$ and $R'_2$ such that the total resistances of the current paths are equal. In particular, because the power plane resistance of the first current path ($R''_1 + R''_2$) exceeds the power plane resistance of the second current path ($R''_2$) by an amount equal to $R''_1$, the total resistances of the two current paths can be made equal to one another if $R'_2$ is set to exceed $R'_1$ by an amount equal to $R''_1$. In other words, by setting the via resistance of the power via 40_2 to be greater than the via resistance of the power via 40_1 by an amount equal to R"₁, the currents I₁ and I₂ will be made equal. This is restated mathematically below:

$$R_1^{total} = R_1'' + R_2'' + R_1'$$

$$R_2^{total} = R_2'' + R_2'$$

$$R_1^{total} = R_2^{total} \rightarrow R_1'' + R_2'' + R_1' = R_2'' + R_2' \rightarrow R_1'' + R_1' = R_2'$$

Note that in the schematic diagrams of FIGS. 4 and 5, the effective resistances of the power vias 40 and portions of the power plane 15 are depicted as resistors, but there are not necessarily any discrete resistors associated with these resistances. Instead, these resistances correspond to the effective internal resistances of the various portions of the conductive paths. Moreover, the currents illustrated in FIG. 5 assume that the power plane 15 and interconnects 45_1 and 45_2 are to carry the supply voltage $V_{DD}$, but the same principles would apply if the power plane 15 carried the ground voltage GND except that the direction of the currents would be reversed.

As noted above, the diameters of the power vias 40 vary so as to reduce the total variation in current/voltage across the power interconnects 45. In some examples, the target diameter for a given power via may be determined through testing and/or simulation to identify a diameter that achieves the desired current/voltage. Specifically, a test device (which may be an actual physical device or a simulated device) in which all of the power vias have uniform via diameters may be used for the testing, and voltages and/or currents of the power interconnects may be measured or simulated. These measured/simulated per-interconnect current/voltage values may be used to determine which interconnects have excess current or voltage (and the magnitude of the excess) and which interconnects have current or voltage deficiencies (and the magnitude of the deficiency). Then, a target resistance for each of the power vias can be determined that will offset the current/voltage excess or deficiency of its corresponding interconnect. For example, if a given interconnect has an excess voltage drop (the voltage drop being the difference between the voltage at the power plane and the voltage at the corresponding connector of the processing circuitry, and the excess voltage drop being the difference between a target voltage drop and the measured voltage drop, wherein the target voltage drop is a either a theoretical voltage drop that would be expected if all interconnects had the same resistance or an statistical aggregation (e.g., mean, median, mode, etc.) of the measured voltage drops), then this can be offset by increasing the resistance of the associated power via 40 by an amount equal to the excess voltage drop divided by the target current flowing through the interconnect (the target current being the theoretical current that would occur if all interconnects had the same resistance). For example, if a given interconnect has a 2 mV excess voltage drop, and the target current for the interconnect is about 2 A, then increasing the resistance of the associated power via by 1 mΩ would reduce the voltage drop at that interconnect by approximately 2 mV, thus eliminating the excess. With the target resistance known, a diameter that achieves this resistance can be determined using known relationships between the resistance of a power via and its diameter. For example, Table 1 below shows such relationships for a given type of power via. To continue the example from above, if the power vias in the test device all had diameters of 0.325 mm and it was determined that a given via should have its resistance increased by 1 mΩ to offset a voltage drop, then using Table 1 the target diameter for the power via 40 in the example device should be reduced to around 0.201 mm, as this would result in an increase in resistance of 0.9 mΩ, which is close to the target increase of 1 mΩ.

TABLE 1

2.515 mm (99 mil) long via with 0.025 mm (1 mil) thick plating

| Drill Diameter (mm) | Drill Diameter (mil) | Via Resistance (mΩ) |
|---|---|---|
| 0.201 | 7.9 | 2.6 |
| 0.225 | 8.9 | 2.4 |
| 0.275 | 10.8 | 2.0 |
| 0.325 | 12.8 | 1.7 |
| 0.375 | 14.8 | 1.5 |
| 0.425 | 16.7 | 1.3 |
| 0.457 | 18 | 1.2 |
| 0.475 | 18.7 | 1.2 |
| 0.610 | 24 | 0.9 |

Table 1 illustrates relationships between drill diameter and resistance for a specific length of via and plating thickness, but similar relationships for other via lengths, plating thicknesses, and/or drill diameters are known to those of ordinary skill in the art and/or can be determined easily using PCB modeling applications or by directly measuring the resistances of test samples.

In some examples, the process described above for determining a target diameter by explicitly determining target resistances for vias may be conducted for each power via individually. In other examples, instead of determining diameters by explicitly determining resistances for the vias on a per-via basis as described above, diameters may be determined for power vias based on their location without necessarily explicitly determining a desired change in resistance for each individual power via. Determining diameters based on location can achieve similar results as explicitly determining desired resistances for each individual power via because the differences in current tend to be distributed among the power vias 40 based on location. Specifically, as already noted above, the farther the power vias 40 are from the center 49 (or the closer the power vias 40 are to a power source 20), the more current they tend to carry, and thus by providing the power vias 40 with decreasing diameter as their distance from the center 49 increases, the variation in currents amount the interconnects can be greatly reduced even without the optimal resistances of each power via 40 being explicitly determined. In other words, in some examples the location of the power via 40 can be used as a convenient proxy for its resistance.

For example, as already noted above, in some implementations multiple power vias 40 may be grouped together based on their general location and the entire group may be given the same bore diameter-specifically, zones 50 may be identified and vias 40 that are in the same zone 50 as one another form a group that are all given the same bore diameter. In some examples, the number and arrangement of the zones 50 may be determined based on simulated or measured voltages and/or currents of a test device, as described above. For example, regions in the array of interconnects that have similar currents and/or voltages as one another in the test system may be identified as zones 50. Alternatively, the number and arrangement of zones 50 may be determined arbitrarily.

The diameters that are associated with each zone may be determined, in some examples, by explicitly determining the diameter for one power via in each zone in the manner described above and then setting the diameter for the entire zone based on that determined diameter. As another example, the diameters for the zones may be determined, in some examples, by explicitly determining the diameter for an outermost zone (e.g., zone 50_4 in FIGS. 1-3) and for an inner most zone (e.g., zone 50_1 in FIGS. 1-4) and then interpolating diameters for the intermediate zones (e.g., zones 50_2 and 50_3 in FIGS. 1-3) based on the diameters of the inner and outer zones. In one example, the bore diameters of the power vias in the zones 50 may comprise 0.610 mm (24 mil) for the inner most zone 50_1, 0.375 mm (14.8 mil) for the next zone 50_2, 0.275 mm (10.8 mil) for the next zone 50_3, and 0.225 mm (8.9 mil) for the next zone 50_4. In some examples, a fifth zone 50 (not illustrated) is also provided surrounding the zone 50_4, and in this fifth zone the bore diameters of the power vias 50 may be 0.201 mm (7.9 mil).

In the example of FIGS. 1-4, four zones 50 are illustrated, namely zones 50_1, 50_2, 50_3, and 50_4 (the zone 50_4 is not visible in FIG. 2), but any number of zones 50 may be provided. In FIGS. 1-4, the zones 50 are defined by boundaries 51_1, 51_2, and 51_3. Specifically, the zone 50_1 comprises all power vias 40 that are within or touching the boundary 51_1, the zone 50_2 comprises all power vias 40 that are within or touching the boundary 51_2 but outside of the boundary 51_1, the zone 50_3 comprises all power vias 40 that are within or touching the boundary 51_3 but outside of the boundary 51_2, and the zone 50_4 comprises all power vias 40 that are outside of the boundary 51_3 (or the power vias that are outside of the boundary 51_3 but inside of a boundary of a next zone if additional zones, not illustrated, are present).

As shown in FIGS. 1 and 3, in one example the boundaries 51 have a circular profile and are arranged concentrically around the center 49, but in other examples the boundaries 51 of the zones 50 may have different shapes. For example, the zones 50 may be elongated along the y-axis to form ellipses (not illustrated). Moreover, although FIGS. 1 and 3 illustrate the array of interconnects 45 and associated power vias 40 as being relatively uniformly filled with interconnects 45 and vias 40, in some examples portions of the array may have areas that are devoid of interconnects 45 and vias 40 or filled with interconnects and vias other than power interconnects 45 and power vias 40. As another example, FIG. 8 illustrates an example device 100 similar to the electronic device 5. The device 100 comprises a PCB 110 similar to the PCB 10 and power vias 140 similar to the power vias 40, except that in the device 100 the power vias 140 are arranged in zones 150 having roughly square shaped boundaries 151. As another example, FIG. 9 illustrates an example device 200 similar to the electronic device 5. The device 200 comprises a PCB 210 similar to the PCB 10 and power vias 240 similar to the power vias 40, except that in the device 200 the power vias 240 are arranged in zones 250 having elongated rectangular shaped boundaries 251. As another example, FIG. 9 illustrates an example device 300 similar to the electronic device 5. The device 300 comprises a PCB 310 similar to the PCB 10 and power vias 340 similar to the power vias 40, except that in the device 300 the power vias 340 are arranged in zones 350 having irregularly shaped boundaries 351. It should be understood that the forgoing examples are provided merely for illustration, and that any shapes may be used for the zones 50. Moreover, the zones 50 do not necessarily need to be contiguous, concentric, symmetrical, or evenly distributed.

In some examples, rather than explicitly determining resistances for each power via or determining diameters based on zones, a mathematical formula may be used to determine via diameter based on location. The location may be, for example, a distance of the power via 40 from a reference point, such as the center 49 or a power source 20. For example, a linear function may be used that relates distance from the reference point to a diameter. For example, this linear function may be formed by first determining a maximum diameter for a power via that is the farthest from the center 49 (or closest to the power source 20) and determining a minimum diameter for a power via that is closest to the center 49 (or farthest from a power source 20), and then fitting a linear function to these two data points. With such a function, the diameters of the power vias would varied linearly with distance between the minimum value and the maximum value. The maximum diameter and minimum diameter mentioned above can be determined using the same approach described above of using a test device and explicitly determining target resistances, except that in this approach the target diameters need only be determined for two of the power vias rather than for all of them. Any other desired type of mathematical formula may be used that relates distance from the reference point to a diameter, such as a quadratic formula, exponential formula, logarithmic formula, or any other formula.

As noted above, the PCB 10 comprises both supply power planes 15 and ground power planes 15, along with associated supply or ground power vias 40 and supply or ground power interconnects 45 coupled respectively thereto. In some examples, only the supply power vias 40 have their diameters varied according to one of the approaches described herein. In other examples, only the ground power vias 40 have their diameters varied according to one of the approaches described herein. In other examples, both the supply and ground power vias 40 have their diameters varied according to one of the approaches described herein. In some examples in which both ground and supply power vias 40 have their diameters varied, the diameters of the supply power vias 40 may be controlled independent from the diameters of the ground power vias 40—i.e., the supply power vias 40 and ground power vias 40 do not necessarily have the same diameters as one another, even if they are located in basically the same location, and different numbers and/or arrangements or zones and/or different functions for determining via diameter may be used as between the supply power vias 40 and the ground power vias 40. In other examples the supply power vias 40 and the ground power vias 40 may have their diameters varied according to the same functions and/or zones so that a power via 40 at a given location will have a given diameter regardless of whether it is a supply power via 40 or a ground power via 40.

As mentioned above, there may be other vias in the device 5 besides the power vias 40. For example, there are the vias 43. In addition, there may be other vias that are not illustrated, such as vias for carrying communication signals. While the techniques described herein for varying via diameter could, in theory, also be used for these other vias, references herein to "power vias" and varying the diameters of the power vias should be understood as referring solely to the power vias 40 unless explicitly indicated otherwise.

Figure 6:
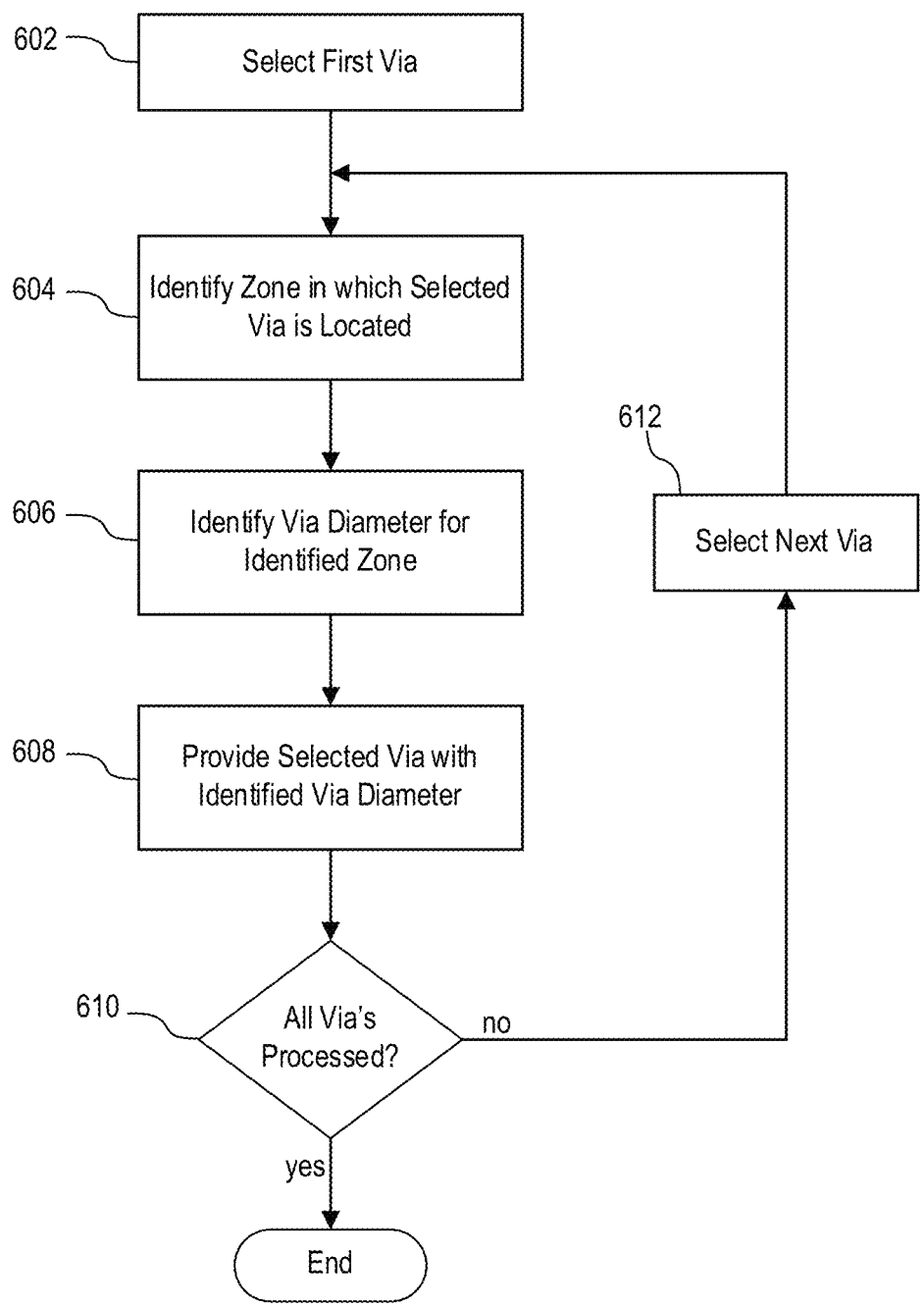
FIG. 6 is a process flow chart illustrating an example method.
Figure 7:
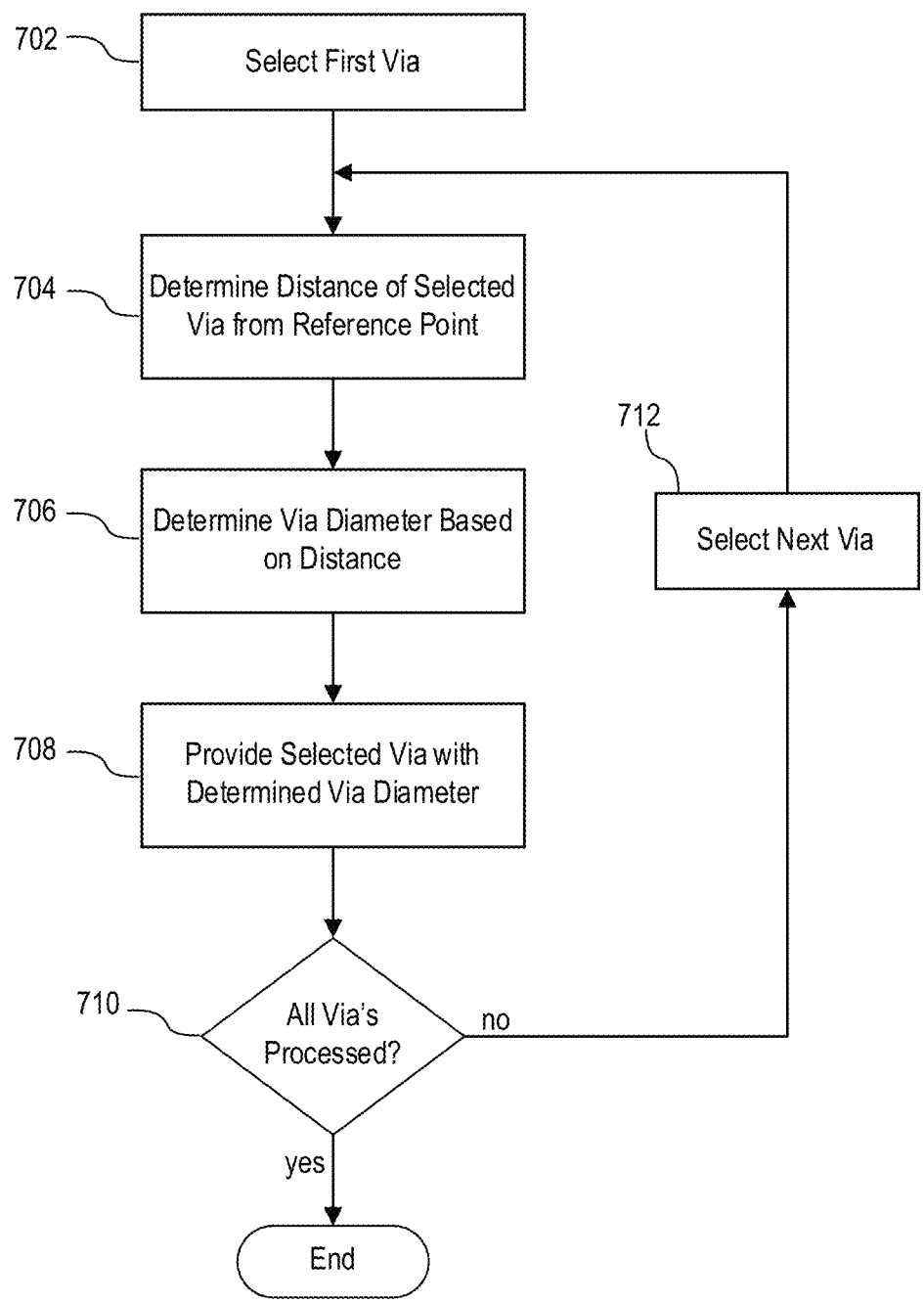
FIG. 7 is a process flow chart illustrating another example method.

Turning now to FIGS. 6 and 7, example methods 600 and 700 will be described. The methods 600 and 700 may be performed, for example, by a person designing or manufacturing an electronic device such as the electronic device 5 and/or by a computer executing machine readable instructions corresponding to the steps of methods 600 and/or 700.

As shown in FIG. 6, the method 600 comprises operations of blocks 602, 604, 606, 608, 610, and 612, which are described in greater detail below. Blocks 604-612 form a loop that is repeated iteratively for each power via out of a plurality of power vias of a printed circuit board.

In block 602, a first power via is selected out of the plurality of power vias. The power vias are to connect one or more power planes to an array of power interconnects for coupling processing circuitry to the printed circuit board. The first power via may be any one of the power vias. It should be understood that at the time block 602 is performed, the power vias may not yet be physically formed in the PCB, and thus selecting the power via in such a case refers to selecting a location in the PCB that is associated with the power via (i.e., the location at which the power via will ultimately be formed).

In block 604, a zone is identified in which the selected power via is located, out of a plurality of zones. The zones comprise regions or areas on the PCB that correspond to portions of the array of power interconnects. The zones may be predefined, in which case block 604 may comprise locating the selected power via and determining which predefined zone it resides in. In other examples, the zones may be determined as part of block 604, for example using one of the approaches described above.

In block 606, a bore diameter associated with the identified zone is identified. For example, a list of predetermined zones and associated diameters may be consulted to identify a bore diameter associated with the identified zone. In other examples, block 606 may comprise determining bore diameters for the zones using one of the approaches described above.

In block 608, the selected via is provided with the identified bore diameter that is associated with the identified zone. In some examples, providing the selected via with the identified bore diameter comprises forming the selected via in the PCB with the selected bore diameter, for example by drilling a bore in the PCB with a drill having the selected bore diameter. The bores of the power vias may later be plated to complete the formation of the power vias, for example after the bores of all of the power vias have been formed (e.g., after block 608 has been performed for each power via). In other examples, providing the selected via with the identified bore diameter comprises entering and/or storing the selected bore diameter in a data structure in association with the selected power via, wherein the data structure defines the configuration of the power vias for subsequent manufacture. For example, the data structure may be a CAD file or a PCB layout file.

In block 610, it is determined whether all of the power vias of the plurality of power vias have been processed, wherein processed refers to the vias being provided with diameters according to blocks 604-608. If not, then the process continues to block 612 and then loops back through blocks 604-608 to process another via. If so, then the process may end.

In block 612, a next via out of the plurality of vias is selected for processing. The process then loops back through blocks 604-608 again for that selected via.

FIG. 7 illustrates another method 700. Blocks 702, 708, 710, and 712 of the method 700 are the same as blocks 602, 608, 610, and 612 already described above, and thus duplicative description of these blocks is omitted. In other words, the method 700 is similar to the method 600 except that blocks 704 and 706 of the method 700 differ from blocks 604 and 606 of the method 600.

In block 704, a distance of the selected power via from a reference point is determined. The reference point may be a center of the plurality of power vias, a center of the processing circuitry, a location of a nearest power source on the PCB, or some other reference point.

In block 706, diameter is determined for the selected power via based on the distance determined in block 704. For example, any of the approaches described above for determining a diameter of a power via based on its distance from a reference point may be used.

In the description above, it is assumed for the sake of convenience that the power sources are arranged on opposite sides of the processing circuitry, and thus in some examples the via diameters are varied in patterns that extend more-or-less radially from a center of array of interconnects. However, this is not the only possible arrangement to which the techniques described herein are applicable. For example, in some cases, a power source or group of power sources may be disposed in a position closer to one side of the array of interconnects, and in such examples the via diameters may vary with distance from those power sources, resulting in more-or-less linear variation in via diameter with distance. One of ordinary skill in the art would understand that a variety of different power source locations and interconnect array shapes could be used, and that the particular way that the via diameters are varied may differ from case to case. Moreover, in some cases factors other than the power source locations may contribute to current variance. These other factors do not necessarily need to be identified or understood in order to mitigate them. For example, the current variances may be measured/modeled as described above to determine what the pattern of variances are, and then via diameters can varied accordingly based on the observed pattern of current variance even if it is unknown what is causing the particular pattern to occur. In addition, although processing circuitry is described in the examples above as the component that draws power through the array of interconnects, it should be understood that the same techniques are applicable to an array of power interconnects for any type of component that may be mounted to a PCB. For example, the component could be a surface mount power connector, an optical transceiver, or any other component. What unifies all these cases, however, is that the via diameters of the power vias are varied based on their location.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An electronic device comprising:
   a printed circuit board (PCB) comprising a power plane and a plurality of power vias electrically connected to the power plane;
   a power source mounted to the PCB and electrically connected to the power plane; and
   an electronic component mounted to the PCB and electrically connected to the plurality of power vias through a plurality of interconnects;
   wherein respective diameters of the plurality of power vias vary based on location;
   wherein the respective diameters of the plurality of power vias vary based on distances of the power vias from a reference point;
   wherein the electronic component comprises contact pads arranged in a pattern and electrically connected to the plurality of power vias by solder balls;
   wherein the reference point corresponds to a center of the pattern of the contact pads; and
   wherein the respective diameters of the plurality of power vias decrease as distances of the power vias from the center increase.

2. The electronic device of claim 1,
   wherein the plurality of power vias are arranged in a plurality of zones concentrically nested around the reference point, each of the zones having a subset of the plurality of power vias, and
   wherein, for each of the zones, the power vias in the respective zone have diameters that are the same as one another and different from the power vias in the other zones.

3. The electronic device of claim 1,
   wherein the respective diameters of the plurality of power vias vary between 0.201 mm and 0.610 mm.

4. The electronic device of claim 1,
   wherein the electronic component comprises processing circuitry.

5. The electronic device of claim 4,
   wherein the processing circuitry comprises an application-specific-integrated-circuit.

6. The electronic device of claim 1, further comprising:
   a plurality of power sources, the power source being one of the plurality of power sources;
   wherein the respective diameters of the plurality of power vias increase as distances of the power vias from one of the plurality of power sources increase.

7. An electronic device comprising:
   a printed circuit board (PCB) comprising a power plane and a plurality of power vias electrically connected to the power plane;
   a power source mounted to the PCB and electrically connected to the power plane; and an electronic component mounted to the PCB and electrically connected to the plurality of power vias;

wherein the plurality of power vias are arranged in a plurality of zones comprising a first zone and a second zone, and wherein the power vias in the first zone each have a first diameter and the power vias in the second zone each have a second diameter, wherein the electronic component comprises contact pads arranged in a pattern and electrically connected to the plurality of power vias by solder balls, wherein the plurality of zones are concentrically nested around the center of the pattern, and wherein, for each of the plurality of zones, the diameters of the power vias in the respective zone are smaller than the diameters of the power vias in any of the zones closer to the center of the pattern and larger than the diameters of the power vias in any of the zones farther from the center of the pattern.

8. The electronic device of claim 7, wherein the respective diameters of the plurality of power vias vary between 0.201 mm and 0.610 mm.

9. The electronic device of claim 7, wherein the electronic component comprises processing circuitry.

10. The electronic device of claim 9, wherein the processing circuitry comprises an application-specific-integrated-circuit.

* * * * *